United States Patent [19]

Cates

[11] Patent Number: 4,766,593
[45] Date of Patent: Aug. 23, 1988

[54] MONOLITHICALLY INTEGRATED TESTABLE REGISTERS THAT CANNOT BE DIRECTLY ADDRESSED

[75] Inventor: Ronnie L. Cates, Tempe, Ariz.

[73] Assignee: Motorola, Inc., Schaumburg, Ill.

[21] Appl. No.: 944,084

[22] Filed: Dec. 22, 1986

[51] Int. Cl.$^4$ ............................................. G01R 31/28
[52] U.S. Cl. ........................................ 371/15; 371/25
[58] Field of Search ................. 371/15, 16, 25, 20; 364/200, 900; 324/73 AT, 73 R

[56] References Cited

U.S. PATENT DOCUMENTS 4,403,287 9/1983 Blahul ................................. 364/200
4,594,544 6/1986 Necoechea ...................... 324/73 AT
4,710,933 12/1987 Powell ................................. 371/25

Primary Examiner—Michael R. Fleming
Attorney, Agent, or Firm—William E. Koch

[57] ABSTRACT

A circuit is provided for testing a plurality of non-readable latch registers. Each of a plurality of first logic gates have an input coupled to one of a plurality of input pins, and an output coupled to an input of each of the latch registers. An address circuit is coupled to the latch registers for selectively addressing one of the latch registers. A plurality of second logic gates each have an input coupled to one output of each of the latch registers and an output coupled to one of the input pins. An enabling circuit is coupled to each of the second logic gates for enabling the logic gates.

10 Claims, 1 Drawing Sheet

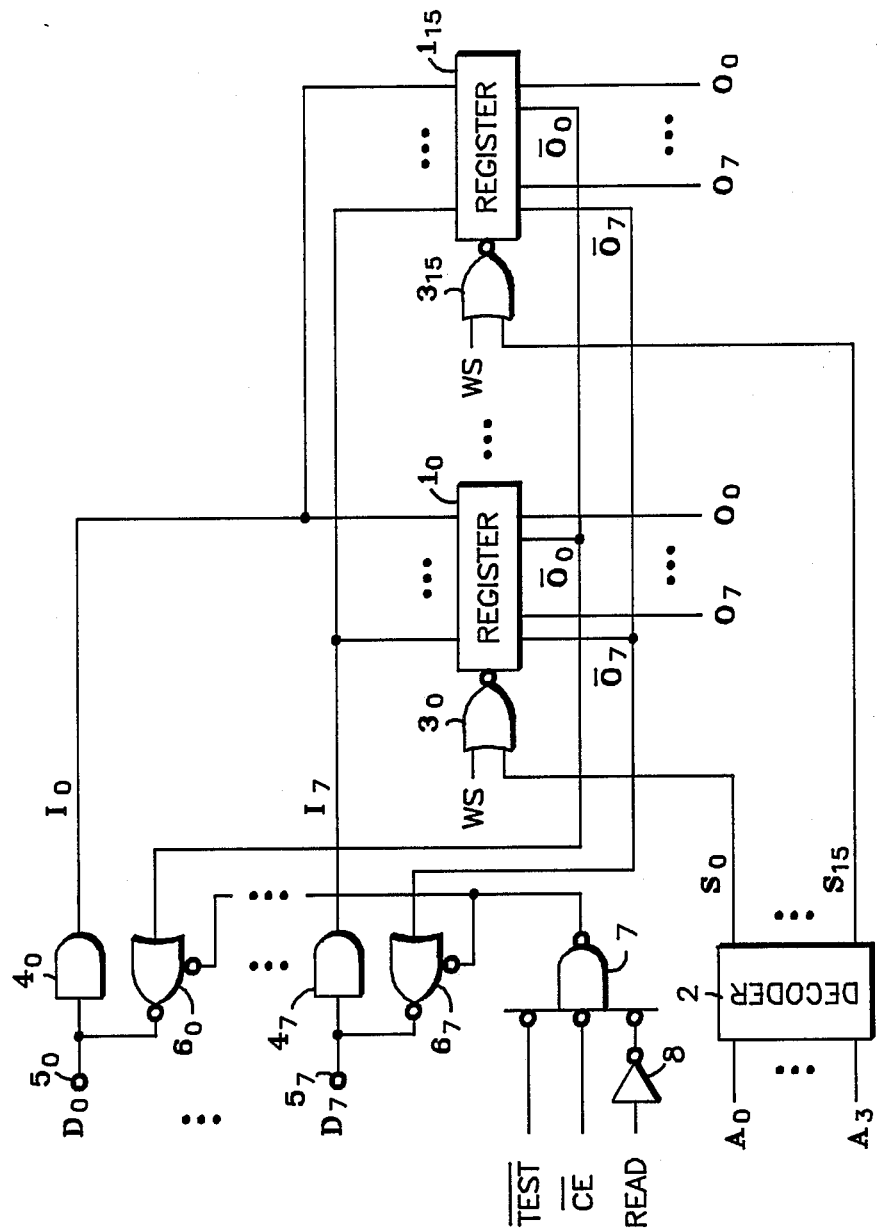

MONOLITHICALLY INTEGRATED TESTABLE REGISTERS THAT CANNOT BE DIRECTLY ADDRESSED

FIELD OF THE INVENTION

This invention relates in general to monolithically integrated latch registers and, more particularly, to a monolithically integrated circuit that provides for the testing of latch registers even though the registers are not directly addressed for reading of the data contained therein.

BACKGROUND OF THE INVENTION

Latch registers are circuits that provide for the storage and transfer of data in digital form. Latch registers may be used to perform any one of several functions in a system, such as serving as control registers for controlling bus functions on a gate array. When programmable latch registers are used in a larger circuit, typically they are addressable so that the contents may be written and read and are therefore readily testable. However, this requires a substantial amount of additional circuitry that consumes valuable space on the silicon chip. Conventional, readable latch registers would require either multiplexers coupled to each register for interpreting the data or tri-state buffers coupled between the registers and a bus.

Therefore, if space on the silicon chip is limited, one typical option is to use non-readable latch registers in order to eliminate this additional circuitry used to test the latch registers. This is especially the case for control registers that are set only one time during power on reset and system initialization.

However, it would still be advantageous to be able to test the functionality of the non-readable registers, whether programmed only during power on reset or reprogrammed during use.

Thus, what is needed is a monolithically integrated circuit that provides for the testing of latch registers even though the registers are not directly readable.

SUMMARY OF THE INVENTION

Accordingly, it is an object of the present invention to provide an improved latch register circuit.

Another object of the present invention is to provide an integrated circuit for testing latch registers even though the registers can not be directly read.

In carrying out the above and other objects of the invention in one form, there is provided a circuit for testing a plurality of non-readable latch registers. Each of a plurality of first logic gates have an input coupled to one each of a plurality of input pins, and an output coupled to an input of each of the latch registers. An address circuit is coupled to the latch registers for selectively addressing one of the latch registers for the write function only. A plurality of second logic gates each have an input coupled to one output of each of the latch registers and an output coupled to one of the input pins. An enabling circuit is coupled to each of the second logic gates for enabling the logic gates.

The above and other objects, features, and advantages of the present invention will be better understood from the following detailed description taken in conjunction with the accompanying drawing.

BRIEF DESCRIPTION OF THE DRAWING

The single figure is a block diagram of the present invention.

DETAILED DESCRIPTION OF THE INVENTION

Referring to the single figure, a circuit in accordance with the present invention is shown which is suitable to be fabricated in monolithic integrated form. Each of a plurality of registers $1_0$ through $1_{15}$ have inputs $I_0$ through $I_7$ and outputs $O_0$ through $O_7$ and complementary output $\overline{O}_0$ through $\overline{O}_7$. Decoder 2 receives address signals $A_0$ through $A_3$ and provides one each of selection signals $S_0$ through $S_{15}$ to one input of each of NOR gates $3_0$ through $3_{15}$. NOR gates $3_0$ through $3_{15}$ also receive write-strobe signal WS and provide an output to each of registers $1_0$ through $1_{15}$, respectively.

Each of AND gates $4_0$ through $4_7$ are coupled to input pins $5_0$ through $5_7$ for receiving one of data signals $D_0$ through $D_7$ as inputs, respectively, and each of AND gates $4_0$ through $4_7$ provide an output, $I_0$ through $I_7$, to each of registers $1_0$ through $1_{15}$, respectively. Although a specific number of devices and signals are called for in the above description, the invention would equally apply to any number latch registers, gates, input terminals, etc.

In accordance with the present invention, NOR gates $6_0$ through $6_7$ are coupled between input pin $5_0$ through $5_7$ and registers $1_0$ through $1_{15}$ for transmitting complementary output signals $\overline{O}_0$ through $\overline{O}_7$ from the selected register to input pins $5_0$ through $5_7$, respectively. Complementary outputs $\overline{O}_0$ through $\overline{O}_7$ are combined in this manner by wire-ORing the collectors of the ECL transistor providing the output in each of registers $1_0$ through $1_{15}$. NAND gate 7 has inputs coupled for receiving read signal READ through inverter 8, chip enable signal $\overline{CE}$, and test signal $\overline{TEST}$ for enabling NOR gates $6_0$ through $6_7$.

During normal operation, data signals $D_0$ through $D_7$ are applied through AND gates $4_0$ through $4_7$ to registers $1_0$ through $1_{15}$ and is written in one of registers $1_0$ through $1_{15}$ as selected by address signals $A_0$ through $A_3$ applied through decoder 2. Each register $1_0$ through $1_{15}$ is written in this manner. The data contents of each of registers $1_0$ through $1_{15}$ is then transferred to additional logic on the integrated circuit (not shown) as output signals $O_0$ through $O_7$.

To test the functionality of registers $1_0$ through $1_{15}$, the registers are filled with a pattern comprising all "1"s, which brings complementary outputs $\overline{O}_0$ through $\overline{O}_7$ all low. Then, data patterns can be written to a single register with the patterns uniquely determining the values on complementary outputs $\overline{O}_0$ through $\overline{O}_7$; thus, creating the ability to read the register without being able to directly address the value for read purposes. After registers $1_0$ through $1_{15}$ have been written, test signal $\overline{TEST}$, chip enable signal $\overline{CE}$, and read signal READ are applied to NAND gate 7, which enables NOR gates $6_0$ through $6_7$. Complementary output signals $\overline{O}_0$ through $\overline{O}_7$ of the selected register may then be read from input pins $5_0$ through $5_7$.

By now it should be appreciated that there has been provided monolithically integrated circuit for testing latch registers even though the registers are not directly readable.

I claim:

1. A circuit having an operation mode and a test mode, said circuit comprising:
   a plurality of input pins, each of said input pins receiving one of a plurality of input signals;
   a plurality of latch registers, each of said plurality of latch registers coupled to said input pins for selectively latching said input signals and having a plurality of outputs and a plurality of complementary outputs, wherein each of said plurality of complementary outputs of each of said plurality of latch registers corresponding to each of said input signals are coupled together;
   first means coupled to said latch registers for selectively enabling one of said latch registers for latching said input signals during said operation mode; and
   second means coupled between said plurality of latch registers and said plurality of input pins for selectively coupling each of said input pins to said corresponding complementary outputs of said latch registers during said test mode.

2. The circuit according to claim 1 further comprising third means coupled to said second means for enabling said second means in response to a test signal for coupling said complementary outputs to said input pins during said test mode.

3. The circuit according to claim 2 wherein said second means comprises a plurality of logic gates, one each of said logic gates having an output coupled to one of said input pins, respectively, an input coupled to the complementary output of each of said plurality of latch registers that corresponds to said input, and an enable input coupled to said third means.

4. The circuit according to claim 3 wherein said third means comprises at least one logic gate coupled for receiving a chip enable signal, a test signal, and a read signal and an output coupled to each of said plurality of logic gates.

5. The circuit according to claim 4 wherein each of said plurality of logic gates comprises a NOR gate.

6. The circuit according to claim 5 wherein said at least one logic gate comprises at least a NAND GATE.

7. The circuit according to claim 6 further comprising a plurality of AND gates, one each of said AND gates having an input coupled to one of said input pins, respectively, and an output coupled to each of said plurality of latch registers.

8. A circuit for testing a plurality of non-readable latch registers, each of said plurality of latch registers having a plurality of inputs, a plurality of outputs, and a plurality of complementary outputs, wherein each of said plurality of complementary outputs of each of said plurality of latch registers corresponding to each of said input signals are coupled together, said circuit including a plurality of input pins, a plurality of first logic gates, each of said first logic gates having an input coupled to one of said input pins and an output coupled to an input of each of said latch registers, first means coupled to said latch registers for selectively enabling one of said latch registers, said circuit comprising:
   a plurality of second logic gates, each of said second logic gates having an input coupled to said complementary output of each of said latch registers, and an output coupled to one of said input pins; and
   second means coupled to each of said second logic gates for enabling said logic gates in response to a test signal for coupling said complementary outputs to said input pins.

9. The circuit according to claim 8 wherein each of said second logic gates comprises a NOR gate.

10. The circuit according to claim 9 wherein said second means comprises a NAND gate having a first input coupled for receiving a read signal, a second input for receiving a chip enable signal, and a third input for receiving a test signal, and an output coupled to each of said second logic gates.

* * * * *